United States Patent [19]

Gottbreht et al.

[11] 4,038,678
[45] July 26, 1977

[54] POWER TRANSISTOR AND THYRISTOR ADAPTER

[75] Inventors: Thomas Leon Gottbreht, Plano; James William Tolson, Garland; Joe Wade Crawford, Dallas, all of Tex.

[73] Assignee: Texas Instruments Incorporated, Dallas, Tex.

[21] Appl. No.: 729,235

[22] Filed: Oct. 4, 1976

[51] Int. Cl.² .................... H01L 23/02; H01L 39/02; H02B 1/04; H02B 1/00
[52] U.S. Cl. ........................................ 357/81; 357/80; 361/388; 174/16 HS
[58] Field of Search ............................. 357/74, 80, 81; 317/100, 101 CC; 174/16 HS

[56] References Cited

U.S. PATENT DOCUMENTS

| 3,192,444 | 6/1965 | Mueller | 357/81 |
|---|---|---|---|
| 3,465,212 | 9/1969 | Grimes et al. | 357/81 |
| 3,697,814 | 10/1972 | Christman et al. | 357/81 |
| 3,742,599 | 7/1973 | Desmond et al. | 357/81 |
| 3,875,478 | 4/1975 | Capstick | 357/81 |
| 4,004,195 | 1/1977 | Harayda et al. | 357/81 |

Primary Examiner—Andrew J. James
Attorney, Agent, or Firm—Harold Levine; René E. Grossman; Stephen S. Sadacca

[57] ABSTRACT

A universal adapter is mounted, in either of two directions, by way of a pair of pedestals disposed at its extremities to a planar surface, usually a heat sink. It has a cavity, formed at its upper surface and another at its lower surface between the pedestals each for receiving one of various types of power transistors and thyristors. A plurality of lead receiving apertures communicate between the lower and upper surface of the adapter to permit passage of the different configurations of leads from the various power transistors and thyristors. Electrical contacts for connection to exterior circuitry are affixed to the upper surface for some of the various types and to the lower surface for others of the various type. In either case, the contacts are positioned adjacent selected ones of the lead apertures through which the power transistor or thyristor leads are threaded and to which the electrical contacts are connected.

9 Claims, 12 Drawing Figures

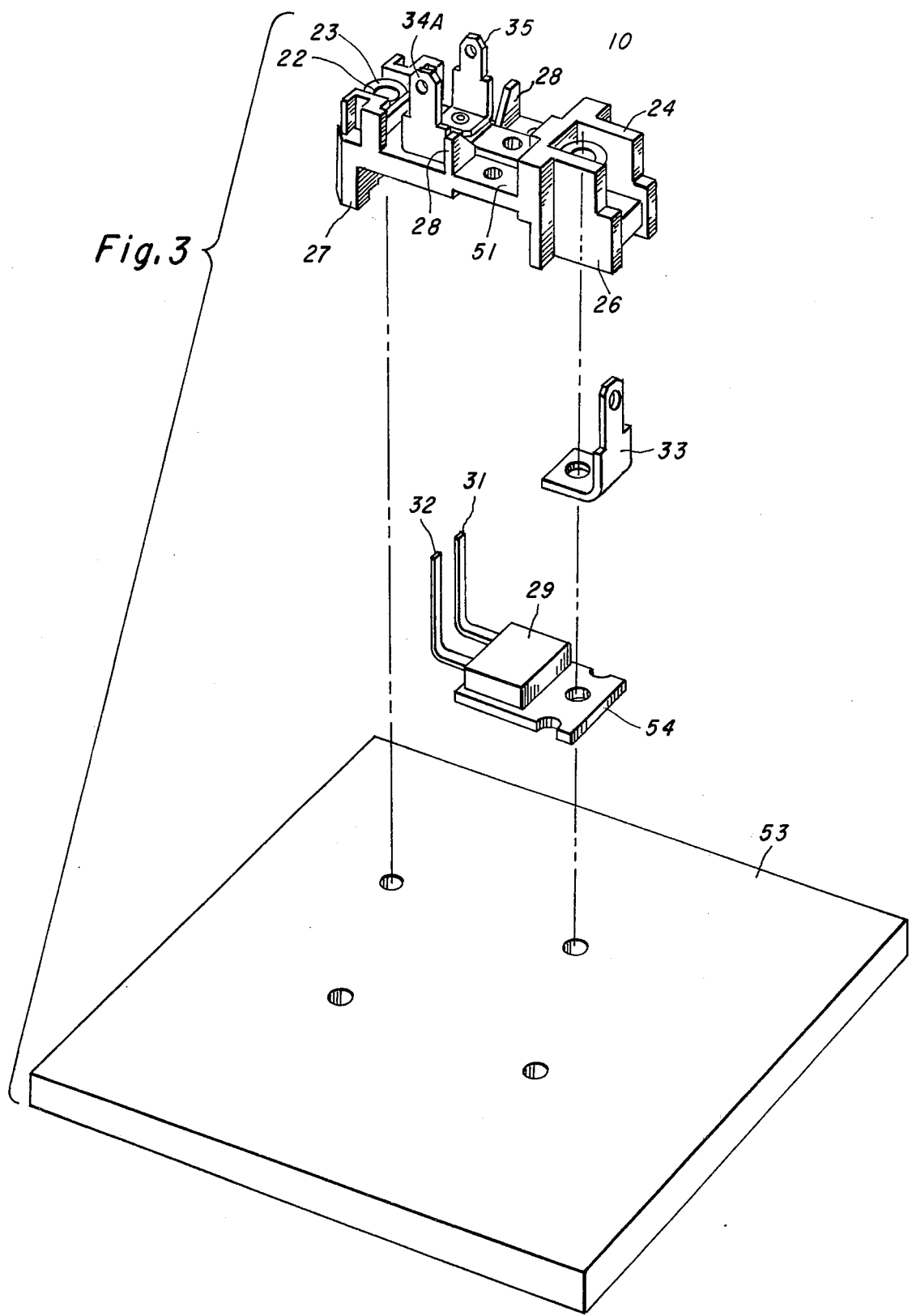

POWER TRANSISTOR AND THYRISTOR ADAPTER

BACKGROUND OF THE INVENTION

1. Field of the Invention

This invention relates to a structure for mounting a power transistor or a thyristor. More specifically, it involves an adapter for semipermanent mounting of a power transistor or thyristor, and providing connectors for disengageable connection with external electrical circuits.

2. Description of the Prior Art

In the prior art, power transistors and thyristors have been attached to a printed circuit board by simply soldering the leads to appropriate conductors on the circuit board. However, for large power devices, this type of connection is not optimum for heat sink interfacing.

Another prior art approach has been to solder the body of the device to a cooper heat sink and then solder the lead wires of the device to appropriate connections. This type of connection may result in too much damage to the device.

BRIEF SUMMARY OF THE INVENTION

An adapter is provided for attachment to a heat sink by way of screwing or riveting through mounting pedestals located at each end of the adapter and extending above the upper surface and below the lower surface thereof. Between the heat sink surface and the lower surface of the adapter as defined by the pedestals is a cavity for placing therein a power transistor or a thyristor with its leads directed in an upwardly direction. Also, a cavity is defined by the pedestals and the upper surface for placing therein a power transistor or thyristor with its leads directed in a downwardly direction. A plurality of lead apertures that pass through the adapter for its lower surface to its upper surface are provided, a combination of any of these apertures being available to accommodate a particular type power transistor or thyristor and also depending upon whether the device is mounted in the upper or lower cavity. The adapter is turned oppositely when the upper cavity is used. Appropriate electrical connectors for connection to a disengageable electrical connector from external circuitry is placed adjacent each selected lead aperture and the leads from the power transistor or thyristor are attached to the electrical connectors.

The main object of this invention is to provide a semipermanent connection for a power transistor or thyristor yet having a readily disengageable means of interconnecting with exterior circuitry.

Another object of this invention is to provide strain relief for the leads of a power transistor or thyristor.

Still another object of this invention is to provide a reliable structure for mounting a power transistor or thyristor to a heat sink.

These and other objects will be made more evident in the detailed description that follows.

BRIEF DESCRIPTION OF THE DRAWINGS

FIG. 3 is an exploded perspective view of the assembled adapter of FIGS. 2A-C.

DETAILED DESCRIPTION OF THE INVENTION

Figure 1A:
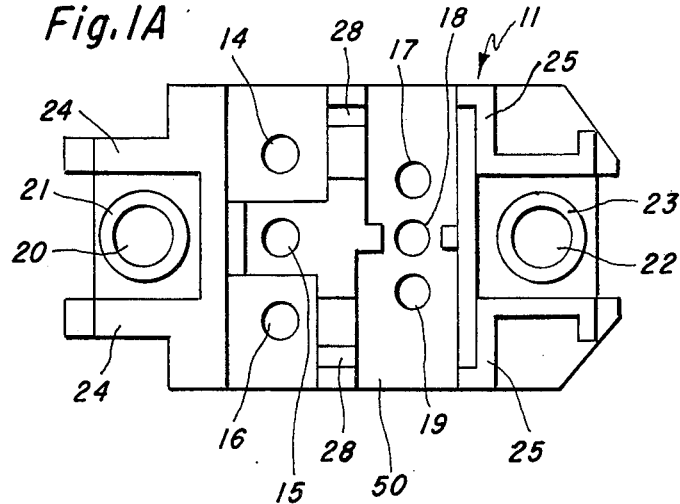
FIG. 1A is a top view of the body member of this invention.

Referring first to FIG. 1A, the top view of body member 11 is illustrated having an upper surface 50 and a pair of legs 28. Upper pedestals 24 and 25 are shown disposed at opposite ends of the body member 11. A mounting aperture 20 is shown surrounded by upwardly projecting mounting cylinder 21. Likewise, mounting aperture 22 is shown with mounting cylinder 23 surrounding it. Apertures 14–19 for receiving leads from one device of various types of power transistors and thyristors communicate between upper surface 50 and lower surface 51.

Figure 1B:
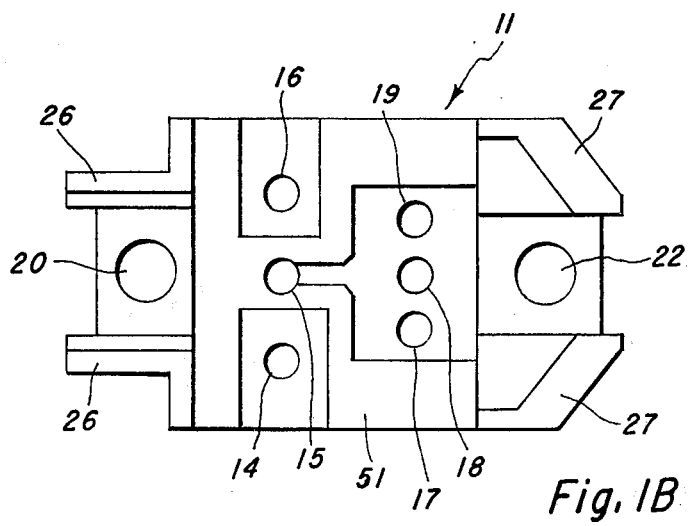
FIG. 1B is a bottom view of the body member of this invention.

FIG. 1B is a bottom view of the body member 11 illustrating lower surface 51 and lower pedestals 26 and 27 positioned at opposite ends of the body member 11.

Figure 2A:
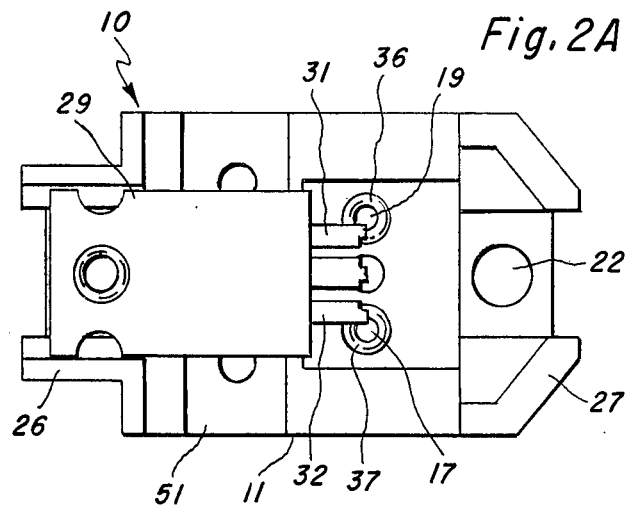
FIG. 2A is a bottom view of a first embodiment of the assembled adapter.

FIG. 2A illustrates one type of the various power transistors and thyristors in position, beneath the lower surface 51 of body member 11. Leads 31 and 32 pass upwardly through apertures 19 and 17, respectively. Swedged sleeve 36 is fitted into aperture 19 and swedged sleeve 37 is fitted into aperture 17.

Figure 2B:
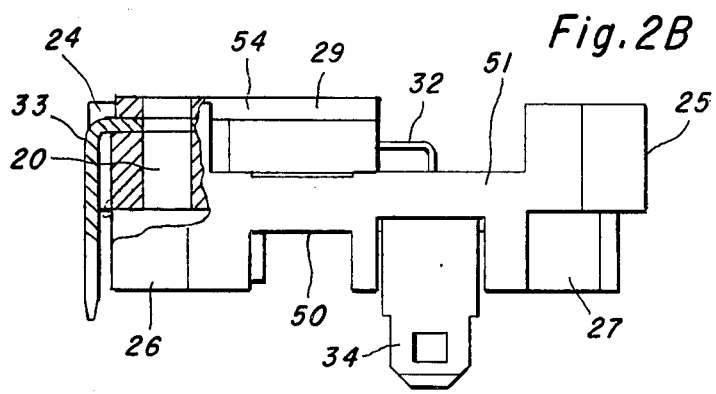
FIG. 2B is a side elevation with partial section of the first embodiment of the assembled adapter.

In FIG. 2B, electrical connector 33 is shown in position adjacent device 29 and over mounting aperture 20 through which a mounting rivet or screw may pass (not shown) to secure contact 33 against the conductive tab 54 of device 29.

Figure 2C:
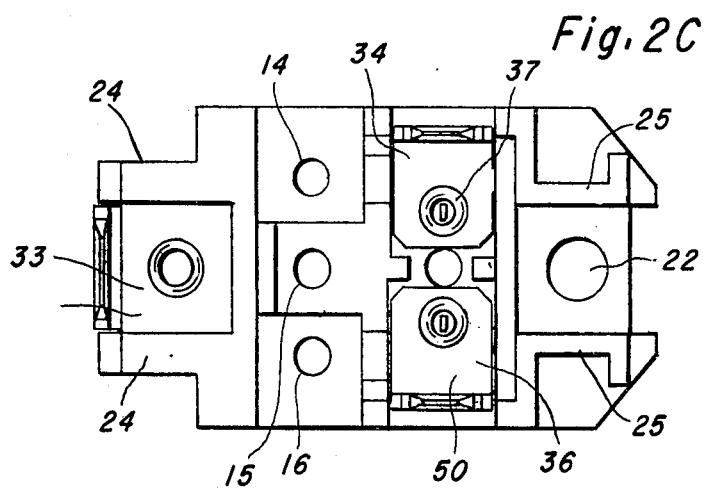
FIG. 2C is a top view of the first embodiment of the assembled adapter.

FIG. 2C shows electrical connectors 34 and 35 swedged into contact with sleeves 36 and 37 through which leads 31 and 32 of device 29 pass and to which such leads are soldered.

FIG. 3 illustrates, in perspective, exactly how the parts of FIG. 2 fit together in an assembled adapter for connection to heat sink 53. Device 29 is shown with leads 31 and 32 projecting upwardly for connection to connectors 34 and 35. Electrical connector 33 is shown positioned above tab 54 of device 29 for electrical and mechanical connection thereto by way of passing a screw or rivet (not shown) through mounting aperture 20 into heat sink 53.

Figure 4A:
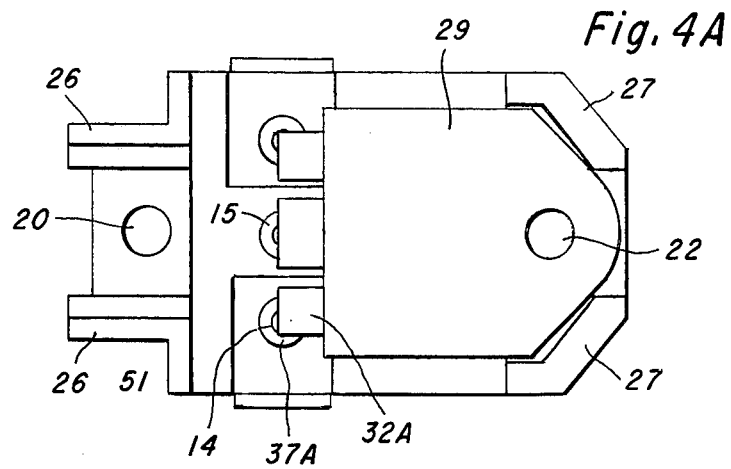
FIG. 4A is a bottom view of a second embodiment of the assembled adapter.

FIG. 4A illustrates a different device 29A from that of FIG. 2 and 3. Device 29A have leads 31A and 32A passing through apertures 16 and 14, respectively, which contain swedged sleeves 36A and 37A, respectively.

Figure 4B:
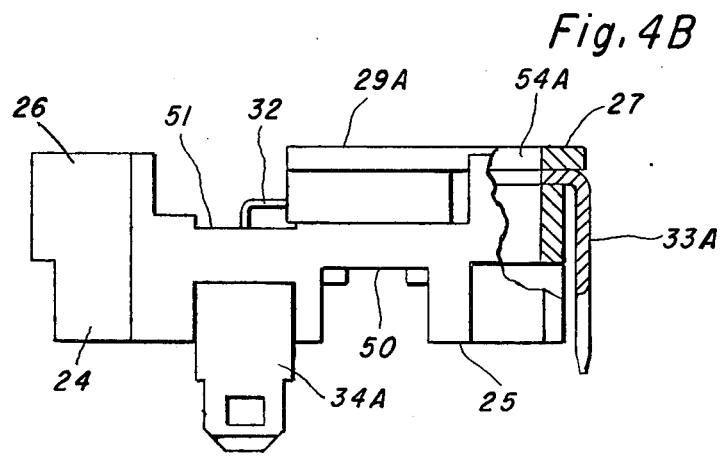
FIG. 4B is a side view with a partial section of the second embodiment of the adapter.

FIG. 4B illustrates connector 33A in electrical and mechanical contact with tab 54A of device 29A and positioned over mounting aperture 22 for connection to a mounting surface by way of a screw or rivet (not shown).

Figure 4C:
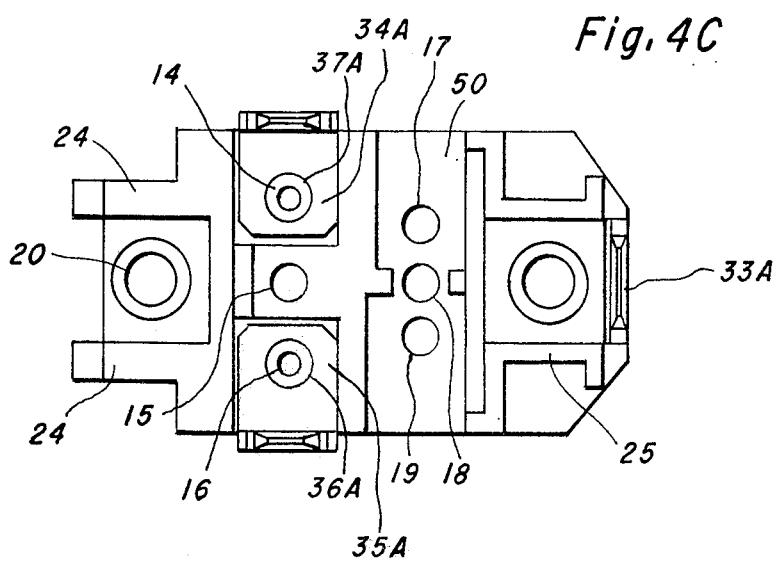
FIG. 4C is a top view of the adapter of FIG. 4A.

FIG. 4C shows connectors 34A and 35A swedged into position by sleeves 37A and 36A. Note that device 29A is mounted at surface 51 as is device 29 shown in FIG. 2, but at the opposite end thereof.

Figure 5A:
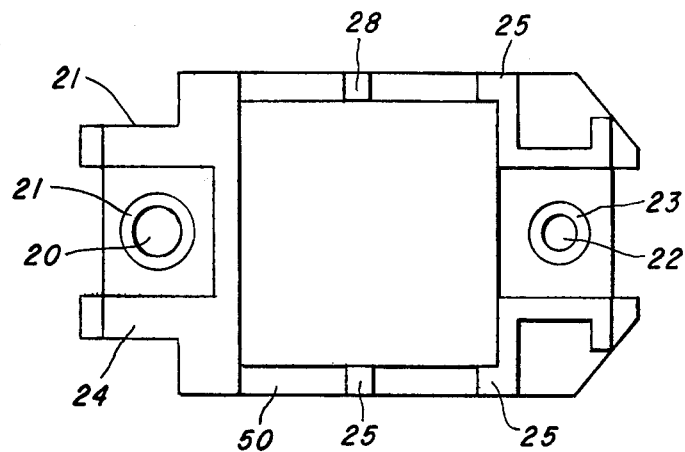
FIG. 5A is the bottom view of the third embodiment of the adapter.

FIG. 5A illustrates still another type device 29B which is mounted at surface 50, opposite the devices shown in FIGS. 2 and 4.

Figure 5B:
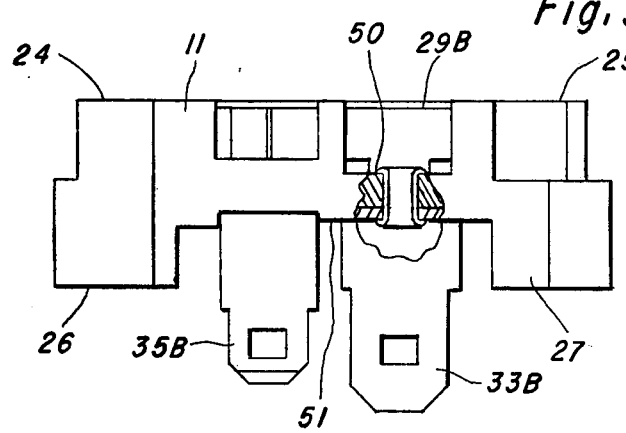
FIG. 5B is a side view with a partial section of the adapter of FIG. 5A.

FIG. 5B illustrates sleeve 38 in position swedged at its lower surface to contact electrical connector 33B and at its upper edge to secure it to the upper surface 50 of body member 11.

Figure 5C:
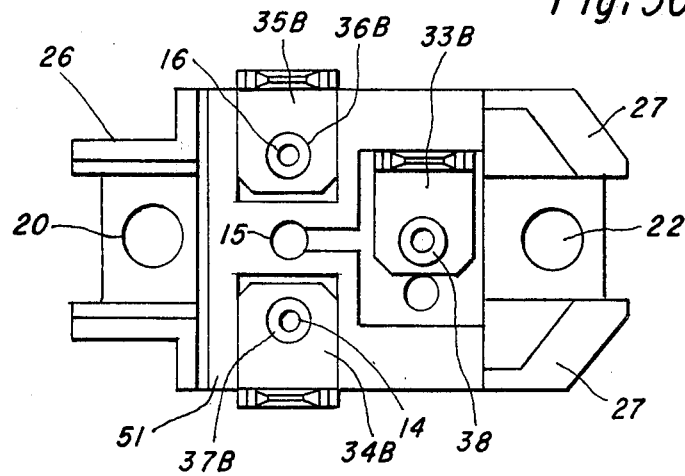
FIG. 5C is a top view of the adapter of FIG. 5A.

FIG. 5C shows electrical connectors 33B, 34B, and 35B all held in position by swedged sleeves 38, 36B and 37B, respectively.

The devices are mountable at surface 50 or surface 51, depending upon the particular type of power transistor or thyristor for connection to the adapter assembly 10. The universality of mounting from either surface permits a wide variance of devices to be connected as shown. Devices other than power transistors and thyristors of like configurations are contemplated herein. It is known that those skilled in the art could make alternations and changes in the general configuration of this adapter without departing from the spirit and scope of the invention.

What is claimed is:

1. A universal adapter, for mounting on a planar surface, to which one of various types of power transistors and thyristors may be attached, comprising:
   a. a body having at least one mounting pedestal connected to its lower surface to provide a power transistor or thyristor accepting cavity, a plurality of lead apertures to accommodate the various types of power transistors and thyristors communicating between the lower and upper surfaces; and
   b. a plurality of electrical contacts for connection to exterior electrical circuits, mounted on the upper surface of the body member, each positioned at a selected one of the lead apertures and attached to a respective lead of the power transistor or thyristor.

2. The adapter of claim 1 further comprising at least one mounting pedestal connected to its upper surface to provide a power transistor or thyristor accepting cavity when turned over for mounting on the planar surface.

3. The adapter of claim 2 wherein each of the selected ones of the lead apertures is provided with a conductive sleeve insert.

4. The adapter of claim 3 wherein the electrical contacts comprise spade type connectors.

5. The adapter of claim 4 wherein the conductive sleeves are swedged over the spade connectors and over the edges of the apertures at the lower surface of the body member to secure the connectors.

6. The adapter of claim 5 wherein the leads of the power transistor or thyristor are connected to the electrical contacts by solder.

7. The adapter of claim 1 wherein there is a mounting pedestal at each end of the body member connected to the lower surface, with the power transistor and thyristor accepting portion located therebetween.

8. The adapter of claim 2 wherein there are two mounting pedestals connected to the upper surface at each end of the body member, with the power transistor and thyristor accepting portion located therebetween.

9. The adapter of claim 7 wherein there are two mounting pedestals connected to the upper surface at each end of the body member, with the power transistor and thyristor accepting portion located therebetween.

* * * * *